(12) United States Patent
Oyamatsu

(10) Patent No.: US 6,815,280 B2
(45) Date of Patent: Nov. 9, 2004

(54) METHOD OF MANUFACTURING A SEMICONDUCTOR DEVICE INCLUDING A PLURALITY OF KINDS OF MOS TRANSISTORS HAVING DIFFERENT GATE WIDTHS

(75) Inventor: Hisato Oyamatsu, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/792,828

(22) Filed: Mar. 5, 2004

(65) Prior Publication Data

US 2004/0169235 A1 Sep. 2, 2004

Related U.S. Application Data

(62) Division of application No. 10/013,368, filed on Dec. 13, 2001, now Pat. No. 6,734,506.

(30) Foreign Application Priority Data

Oct. 11, 2001 (JP) .......................................... 2001-314164

(51) Int. Cl.[7] .......................................... H01L 21/8238
(52) U.S. Cl. ........................ 438/199; 438/230; 438/303
(58) Field of Search ................................ 438/199, 217, 438/218, 230, 231, 275, 301, 303

(56) References Cited

U.S. PATENT DOCUMENTS

| 5,512,500 A | 4/1996 | Oyamatsu |
| 5,923,969 A | 7/1999 | Oyamatsu |
| 5,963,803 A | 10/1999 | Dawson et al. |
| 6,162,672 A | 12/2000 | Lee |
| 6,198,140 B1 | 3/2001 | Muramoto et al. |
| 6,264,167 B1 | 7/2001 | Hamazawa |
| 6,337,248 B1 * | 1/2002 | Imai ........................... 438/279 |
| 6,468,860 B1 * | 10/2002 | Polavarapu et al. ........ 438/257 |

FOREIGN PATENT DOCUMENTS

| JP | 57-62052 | 4/1982 |
| JP | 2000-269491 | 9/2000 |

* cited by examiner

*Primary Examiner*—Hoai Pham
(74) *Attorney, Agent, or Firm*—Oblon, Spivak, McClelland, Maier & Neustadt, P.C.

(57) ABSTRACT

A semiconductor device, comprises a first MOS transistor including a gate electrode having a gate width Le and a first gate post oxide film formed on the circumferential side wall of the gate electrode, and a second MOS transistor including a gate electrode having a gate width Li smaller than the gate width Le of the gate electrode of the first MOS transistor and a second gate post oxide film formed on a circumferential side wall of the gate electrode and having a portion differing in thickness from the first gate post oxide film.

4 Claims, 11 Drawing Sheets

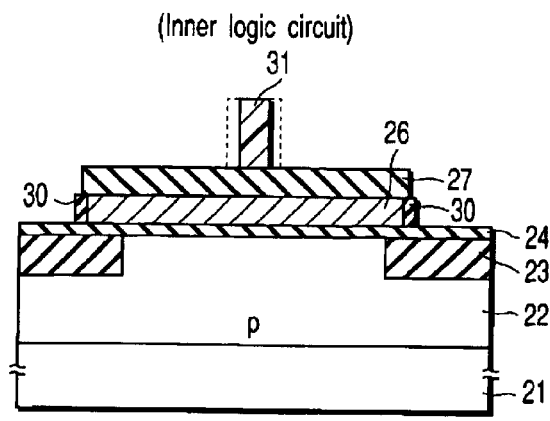
F I G. 11A
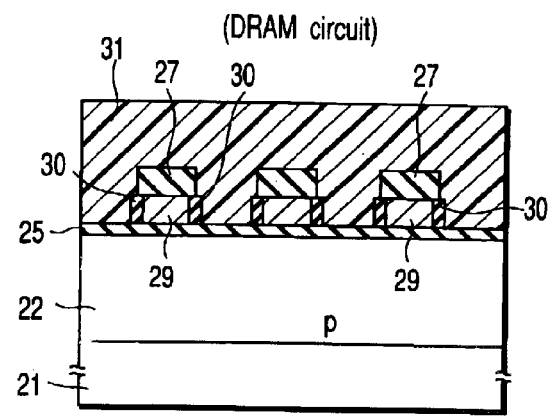
F I G. 11B
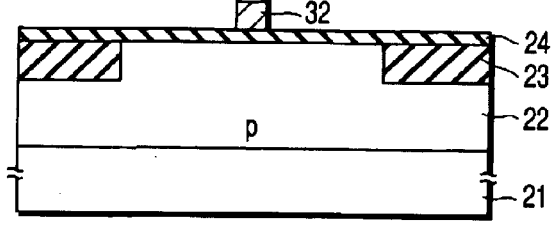
F I G. 12A
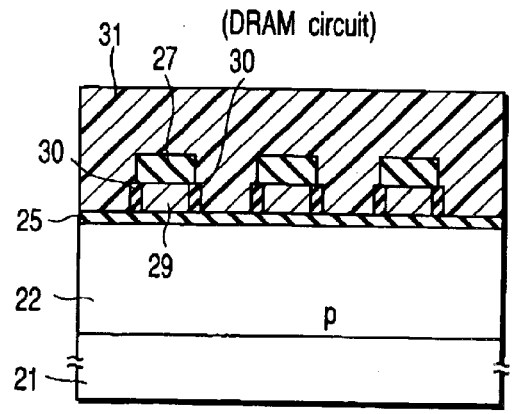
F I G. 12B

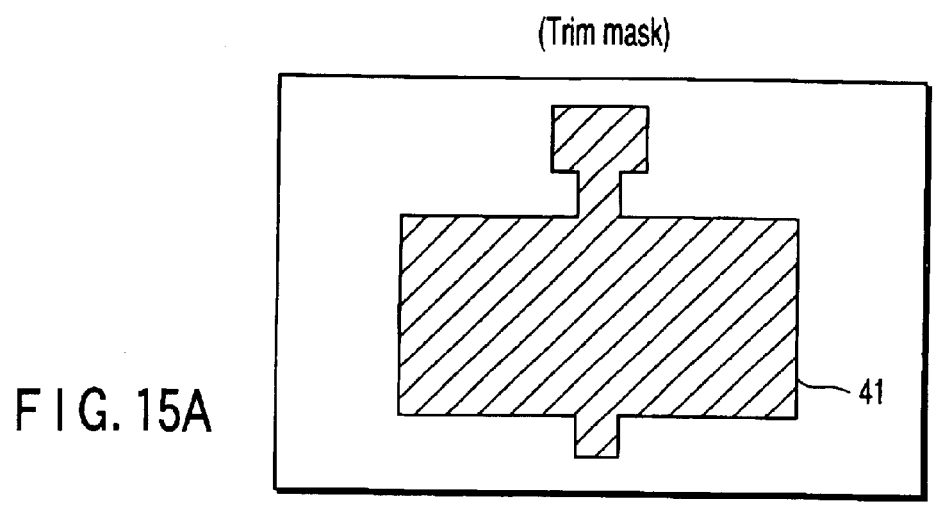
F I G. 15A
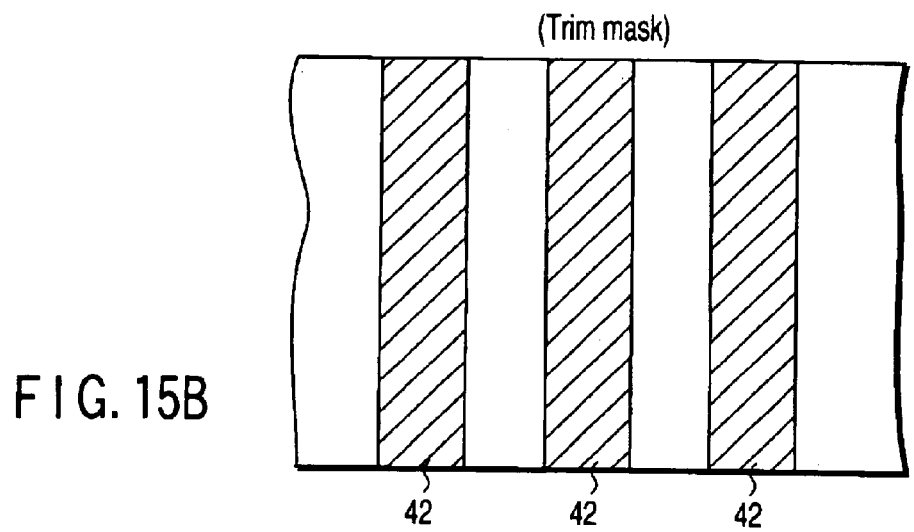
F I G. 15B
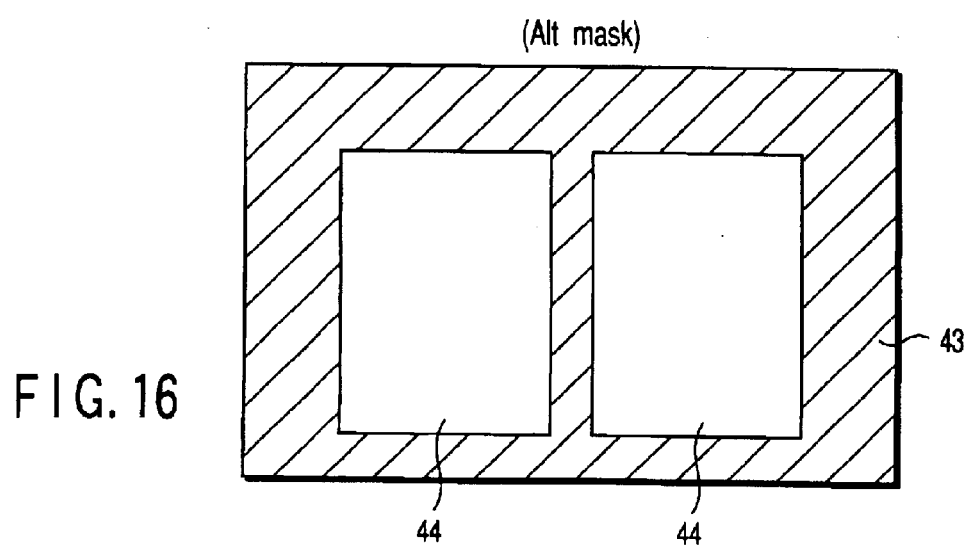
F I G. 16

METHOD OF MANUFACTURING A SEMICONDUCTOR DEVICE INCLUDING A PLURALITY OF KINDS OF MOS TRANSISTORS HAVING DIFFERENT GATE WIDTHS

CROSS-REFERENCE TO RELATED APPLICATIONS

This application is a division of and claims the benefit of priority under 35 USC §120 from U.S. Ser. No. 10/013,368, filed Dec. 13, 2001, now U.S. Pat. No. 6,734,506, and is based upon and claims the benefit of priority under 35 USC §119 from Japanese Patent Application No. 20011-314164, filed Oct. 11, 2001, the entire contents of which are incorporated herein by reference.

BACKGROUND OF THE INVENTION

1. Field of the Invention

The present invention relates to a semiconductor device including a plurality of kinds of MOS transistors and a method of manufacturing the same.

2. Description of the Related Art

The performance of an LSI is being rapidly improved in accordance with the miniaturization of the device, the improvement in the device performance achieved by the miniaturization, and the improvement in the degree of integration, which are achieved by the development of the process technology. The shortening in the wavelength of the light used in performing a pattern transfer in the lithography process for transferring a pattern onto mainly a semiconductor device greatly contributes to the miniaturization in the size of the device. The shortening in the wavelength of the light is performed by using successively a g-line (436 nm) of an Hg lamp, an i-line (365 nm) of an Hg lamp, a KrF laser (248 nm) and an ArF laser (193 nm). Also, when it comes to a fine design not larger than 0.1 μm, a light exposure technology using an $F_2$ laser having a further shorter wavelength and a direct image depicting technology using an X-ray or an electron beam are being studied.

However, the development of the light exposure technology and the image depicting technology using an optical system and an electronic system utilizing light of a shorter wavelength necessitates an improvement in the mechanical accuracy for realizing the miniaturization so as to make it more difficult technically to develop the particular light exposure technology and the image depicting technology.

Under the circumstances, the resolution limit has been improved by improvements in the resist material on to which a pattern is transferred, and by improvements in the illuminating method in the lithography process. Also, it is possible nowadays to form a device of a size not larger than half the wavelength of the light by an ultra high resolution technology called "phase shift method" in which the contrast of the light on a wafer is increased by controlling the phase of the light for each pattern on a reticle.

However, in the phase shift method, the interference of light needs to be skillfully performed to achieve a high contrast, which makes it difficult to form the smallest device size uniformly in respect of various pattern arrangements.

An ultra high resolution light exposure technology, achieved by the "Levenson method", which is a kind of a phase shift method, will now be described. In the Levenson method, a shifter is arranged such that the phases of the light on both sides of a pair of patterns on a reticle (mask) are reversed to each other so as to improve the contrast. Since the contrast is enhanced in the Levenson method by allowing light beams substantially equal to each other in intensity to interfere with each other, the Levenson method is one of the best methods offered by ultra high resolution technology.

However, if there is a boundary portion in the shifter, the light interferes with the light of the reversed phase even in the region in which a pattern is not formed, with the result that a resist pattern remains, as in the pattern region. In order to avoid this difficulty, in the Levenson method the final pattern formation is generally performed using a reticle called a "trim mask", in addition to an "alternate mask (Alt mask)" having a shifter formed therein in advance.

FIGS. 1A and 1B exemplify an Alt mask and a trim mask used for forming the gate electrode of a MOS transistor. In the Alt mask shown in FIG. 1A, a light shielding portion 61 consisting of, for example, a Cr film is formed on a quartz plate. A shifter is formed in an open portion 62 in which the Cr film is not formed by removing the quartz plate in that portion by a predetermined thickness. In the trim mask shown in FIG. 1B, the light shielding portion 61 alone consisting of a Cr film is formed on the quartz plate.

FIG. 1C shows an overlay image in which the Alt mask and the trim mask are overlapped with each other. FIG. 1D shows a pattern obtained by exposing a resist to light by overlapping the Alt mask and the trim mask, followed by applying a developing treatment. In FIG. 1D, a resist pattern 63 is used for patterning the gate electrode. Reference numeral 64 shown in FIG. 1D denotes an active region of the MOS transistor.

The specific method of manufacturing a memory mixed LSI in which an inner logic circuit and a DRAM circuit are formed integral by the Levenson method will now be described with reference to FIGS. 2A, 2B to 5A, 5B. Incidentally, FIGS. 2A to 5A are cross sectional views each showing a part of the inner logic circuit. Also, FIGS. 2B to 5B are cross sectional views each showing a part of the DRAM circuit. In the DRAM circuit, the STI (shallow trench isolation) structure, the trench capacitor structure, etc. are omitted, and the construction of the gate electrode alone is shown in the drawings.

In the first step, as shown in FIGS. 2A and 2B, a p-well region 72 and an n-well (not shown) are formed on a semiconductor substrate 71 in order to form a CMOS transistor. Then, after formation of an isolation insulating film 73, gate insulating films 74, 75 are formed on the side of the inner logic circuit and on the side of the DRAM circuit, respectively. Further, a polycrystalline silicon (polysilicon) film 76 is formed on the entire surface, followed by successively forming an antireflection film 77 and a resist film 78 on the polysilicon film 76.

In the next step, the gate electrode pattern is transferred into the resist 78 by a lithography process by the Levenson method using two masks, i.e., an Alt mask and a trim mask, followed by a developing treatment so as to leave the resist 78 unremoved in the shape as shown in FIGS. 3A and 3B.

Then, the antireflection film 77 is selectively removed by an anisotropic dry etching by using the resist 78 as a mask, as shown in FIGS. 4A and 4B. Further, a trimming treatment for reducing the sizes of the antireflection film 77 and the resist 78 is performed by isotropic etching, as shown in FIGS. 5A and 5B, followed by selectively etching the polysilicon film 76 by using the antireflection film 77 and the resist 78 as a mask so as to form a gate electrode 79 made of a polysilicon film in each of the inner logic circuit and the DRAM circuit. A standard CMOS process is employed in the subsequent step so as to form an LSI.

FIGS. 6A and 6B show the overlay images formed by the Alt mask and the trim mask used in the method described above. FIG. 6A shows the image on the side of the inner logic circuit, with FIG. 6B showing the image on the side of the DRAM circuit.

In FIG. 6A, a region 81 corresponds to the open portion on the Alt mask, and a region 82 corresponds to an open portion on the trim mask. Also, in FIG. 6B, a region 83 corresponds to an open portion on the trim mask. Incidentally, a reference numeral 84 shown in FIG. 6A denotes an active region of the MOS transistor.

In the conventional method described above, it is possible to form a fine gate electrode on the side of the DRAM circuit. However, it is necessary to ensure an allowance in the pattern clearance in view of the trimmed portion because a trimming treatment is also applied to the resist pattern on the side of the DRAM circuit.

Also, on the side of the inner logic circuit, it is certainly possible to form a fine gate electrode. However, it is necessary to design the pitch of the gate electrodes in a manner to have an allowance as in the design on the side of the DRAM circuit, with the result that a problem remains unsolved in terms of miniaturization of the device.

It should be noted that, in order to improve the performance of the logic LSI, it is strongly required to improve the device performance achieved by the miniaturization of the MOS transistor. In order to realize a complex logic in the logic LSI, the pattern arrangement of the MOS transistor is rendered more diversified, compared with the memory SLI. Further, because a complex wire connection is required for realizing various logic modes, the degree of integration of the MOS transistor is rendered lower than that of the memory LSI. Because of the low degree of integration and the necessity of forming fine the gate electrode, employed is the trimming technology for making thinner the resist formed by the lithography and the material deposited on the gate electrode by the isotropic etching as shown in FIGS. 5A and 5B so as to make it possible to reduce the final size of the gate electrode to a region not larger than one third of the wavelength of the light.

On the other hand, the progress in recent years of fine processing technology for producing semiconductor process has realized improvements in the device performance and an in the degree of integration. In recent years, the placing of a memory of a large capacity on a logic LSI has come the key technology in the improvement of the system performance. The strong demands for the mixed LSI satisfies simultaneously the various needs of devices differing from each other in the power source voltage on the LSI, and the processing technology of a fine pitch for realizing a large capacity memory.

In considering the system-on-silicon (SOC) for the future, it is necessary to form fine the gate electrode in the fine MOS transistor included in the inner circuit, required for a high operating speed. Also, it is necessary to increase the gate width of the gate electrode to some extent in the MOS transistor used in the peripheral circuit or in the memory circuit. However, the wiring pitch in the peripheral circuit or the memory circuit is at least as severe as that in the inner circuit. Also, the fine MOS transistor included in the inner circuit requiring a high operating speed differs from the MOS transistor used in the peripheral circuit or the memory circuit in the power source voltage used and in the severe retention performance required of the memory circuit. Under the circumstances, it is necessary to render these two MOS transistors different from each other in the thickness of the gate post oxide film and in the degree of making the corner portion roundish in the lower portion of the gate electrode.

However, in the conventional method, the patterning of the gate electrodes of all the MOS transistors is performed simultaneously. In addition, the trimming of the mask materials used for the patterning of the gate electrodes of all the MOS transistors is also performed simultaneously. It follows that it is difficult to freely set the optimum gate width, wiring pitch and thickness of the gate post oxide film of the gate electrode to suit the various intended uses of the gate electrode.

As described above, the prior art gives rise to the problem that it is difficult freely to set the optimum gate width, wiring pitch and thickness of the gate post oxide film to suit the various intended uses of the gate electrode, for integrating various MOS transistors.

BRIEF SUMMARY OF THE INVENTION

According to one aspect of the present invention, there is provided a semiconductor device, comprises a first MOS transistor including a first gate electrode having a first gate width and a first gate post oxide film formed on a circumferential side wall of the first gate electrode; and a second MOS transistor including a second gate electrode having a second gate width smaller than the first gate width and a second gate post oxide film formed on a circumferential side wall of the second gate electrode and having a portion differing in thickness from the first gate post oxide film.

According to another aspect of the present invention, there is provided a method of manufacturing a semiconductor device, comprises forming a gate insulating film in each of a region in which a first MOS transistor is to be formed and another region in which a second MOS transistor is to be formed on a semiconductor substrate; forming a film of a gate electrode material on the entire surface; forming a film of a resist material on the entire surface; patterning the film of the resist material in a manner to have a pattern of a size larger than the gate width of the gate electrode of at least the first MOS transistor in the region where the first MOS transistor is to be formed and to have a pattern conforming with the gate electrode of the second MOS transistor in the region in which the second MOS transistor is to be formed so as to form a first mask; selectively etching the film of the gate electrode material by an etching method using the first mask so as to form the gate electrode of the second MOS transistor; after removing the first mask, applying an oxidizing treatment so as to form a first gate post oxide film on a circumferential side wall of the gate electrode of at least the second MOS transistor; after forming a film of a resist material on the entire surface, patterning the film of the resist material in a manner to have a pattern conforming with the gate electrode of the first MOS transistor in the region where the first MOS transistor is to be formed and a pattern covering the entire surface in the region in which the second MOS transistor is to be formed so as to form a second mask; selectively etching the film of the gate electrode material by an etching method using the second mask so as to form the gate electrode of the first MOS transistor; and applying an oxidizing treatment so as to form a second gate post oxide film differing in thickness from the first gate post oxide film on a circumferential side wall of the gate electrode of the first MOS transistor in the region other than the region in which the first gate post oxide film is formed.

BRIEF DESCRIPTION OF THE SEVERAL VIEWS OF THE DRAWING

FIGS. 11A and 11B are cross sectional views showing the manufacturing step following the manufacturing step shown in FIGS. 10A and 10B;

FIGS. 12A and 12B are cross sectional views showing the manufacturing step following the manufacturing step shown in FIGS. 11A and 11B;

FIG. 15A is a plan view showing the trim mask being used in manufacturing an LSI according to one embodiment of the present invention;

FIG. 15B is a plan view showing the trim mask being used in manufacturing an LSI according to one embodiment of the present invention;

FIG. 16 is a plan view showing the Alt mask being used in manufacturing an LSI according to one embodiment of the present invention;

DETAILED DESCRIPTION OF THE INVENTION

Figure 1A:
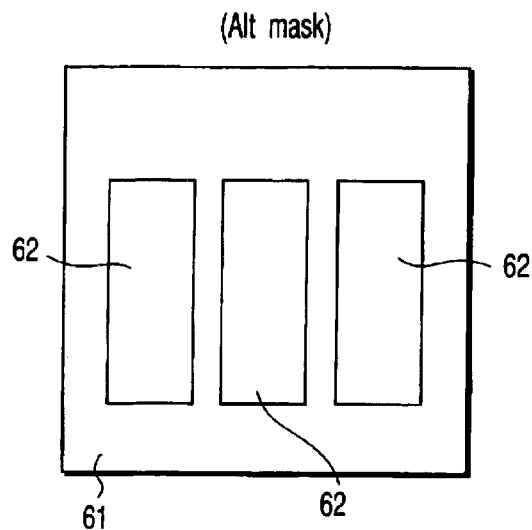
FIG. 1A is a plan view exemplifying an Alt mask used in the conventional method.
Figure 1B:
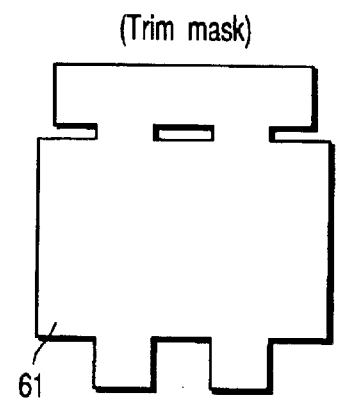
FIG. 1B is a plan view exemplifying a trim mask used in the conventional method.
Figure 1C:
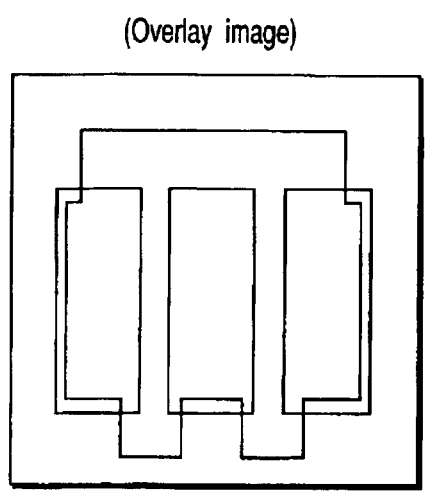
FIG. 1C is a plan view showing an overlay image in which the Alt mask shown in FIG. 1A and the trim mask shown in FIG. 1B are allowed to overlap with each other.
Figure 1D:
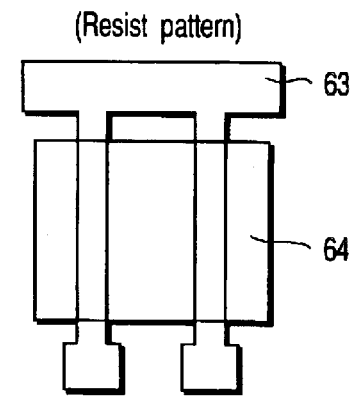
FIG. 1D is a plan view showing a pattern obtained by applying a light exposure treatment and a developing treatment to a resist by using the Alt mask shown in FIG. 1A and the trim mask shown in FIG. 1B.
Figure 2A:
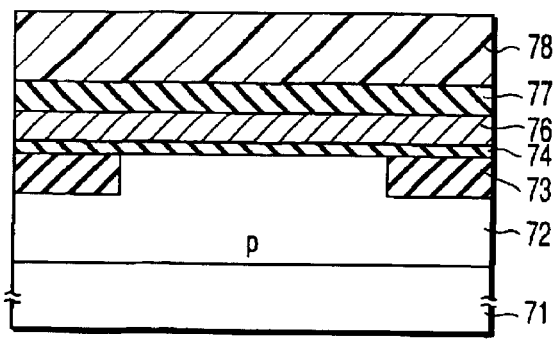
FIGS. 2A and 2B are cross sectional views collectively showing the initial step of manufacturing a memory mixed LSI by the conventional method.
Figure 2B:
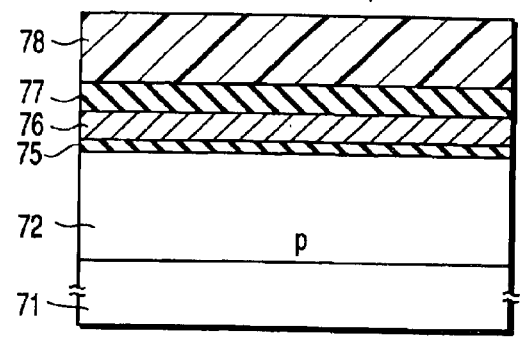
Figure 3A:
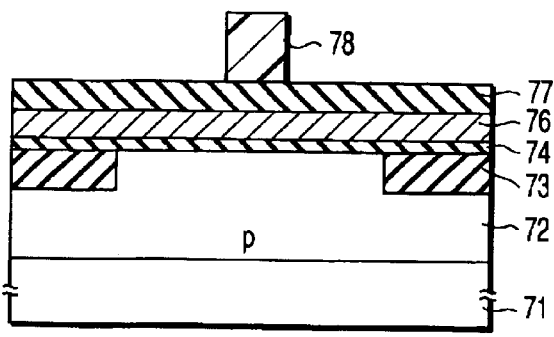
FIGS. 3A and 3B are cross sectional views showing the manufacturing step following the manufacturing step shown in FIGS. 2A and 2B.
Figure 3B:
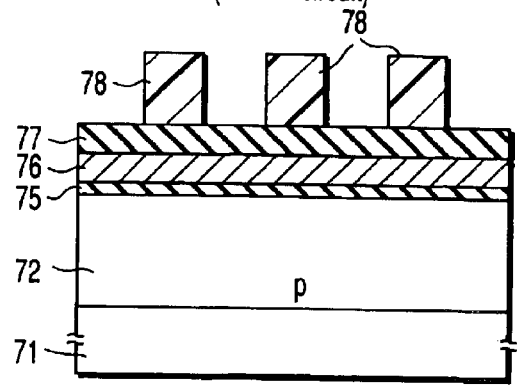
Figure 4A:
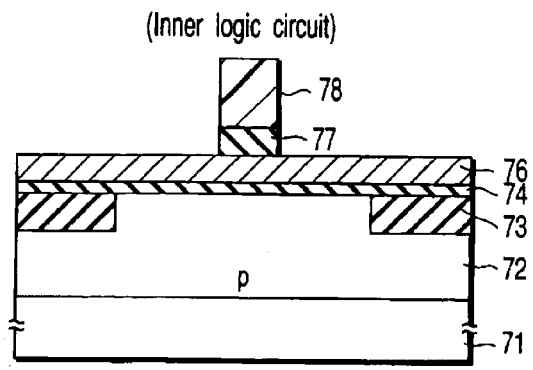
FIGS. 4A and 4B are cross sectional views showing the manufacturing step following the manufacturing step shown in FIGS. 3A and 3B.
Figure 4B:
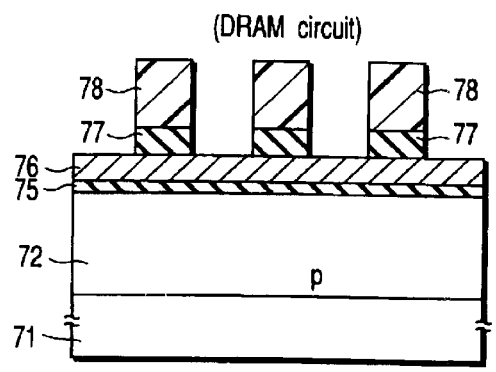
Figure 5A:
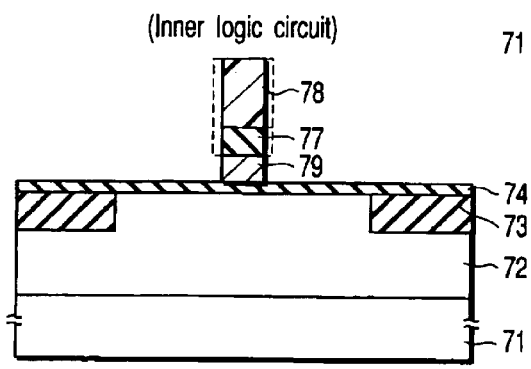
FIGS. 5A and 5B are cross sectional views showing the manufacturing step following the manufacturing step shown in FIGS. 4A and 4B.
Figure 5B:
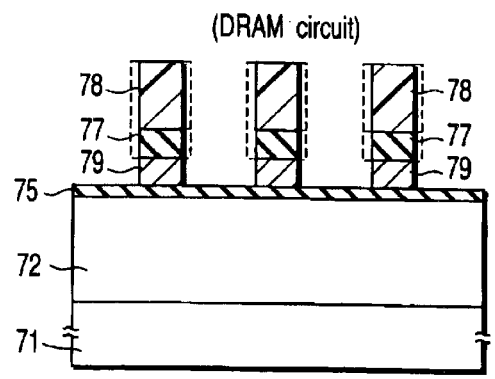
Figure 6A:
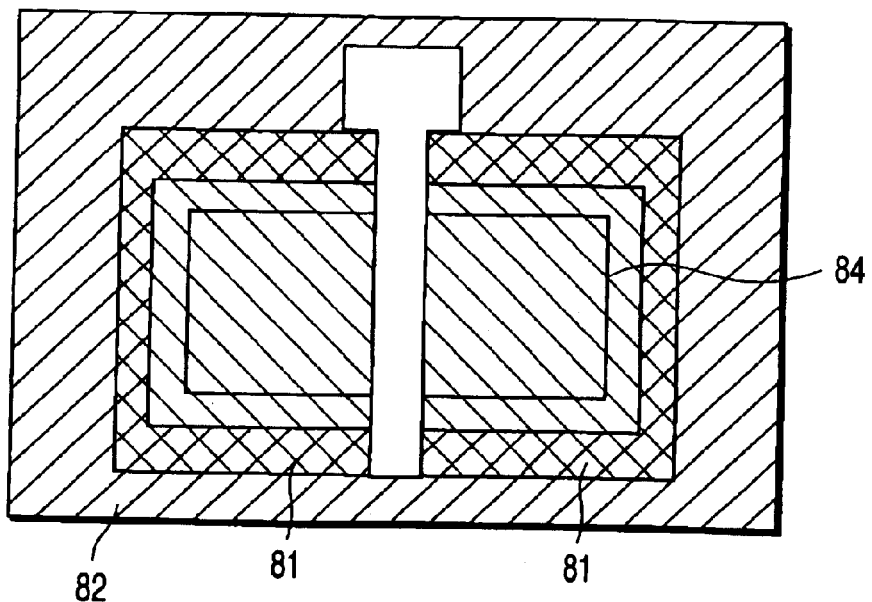
FIG. 6A shows an overlay image on the side of the inner logic circuit by the Alt mask and the trim mask used in the conventional method.
Figure 6B:
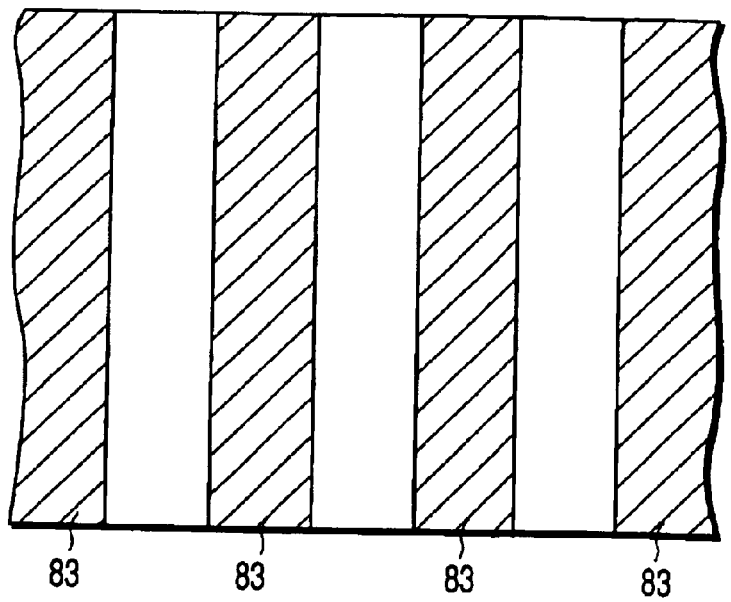
FIG. 6B shows an overlay image on the side of the DRAM circuit by the Alt mask and the trim mask used in the conventional method.

An embodiment of the present invention will now be described in detail with reference to the accompanying drawings, covering the case where the technical idea of the embodiment of the present invention is applied to a memory mixed LSI in which an inner logic circuit and a DRAM circuit are mounted together.

FIGS. 7A, 7B to 14A, 14B are cross sectional views collectively showing successively the steps for manufacturing the LSI, where FIGS. 7A to 14A are cross sectional views showing a part of the inner logic circuit, and FIGS. 7B to 14B are cross sectional views showing a part of the DRAM circuit. Also, FIGS. 15A, 15B and 16 are plan views showing the mask used in manufacturing the LSI. Incidentally, the STI (shallow trench isolation) structure, the trench capacitor, etc. for the DRAM circuit are not shown in FIGS. 7A, 7B to 14A, 14B, and the construction of the gate electrode alone is shown in the drawings.

Figure 7A:
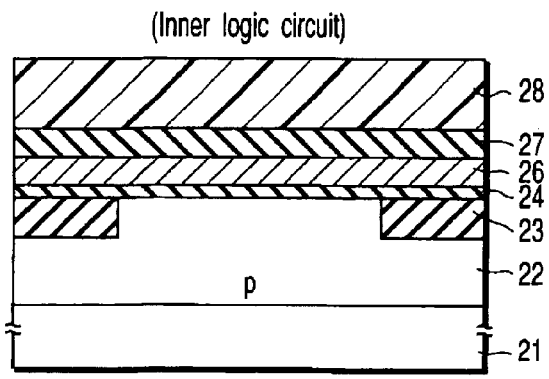
FIGS. 7A and 7B are cross sectional views collectively showing the initial step of manufacturing an LSI according to one embodiment of the present invention.
Figure 7B:
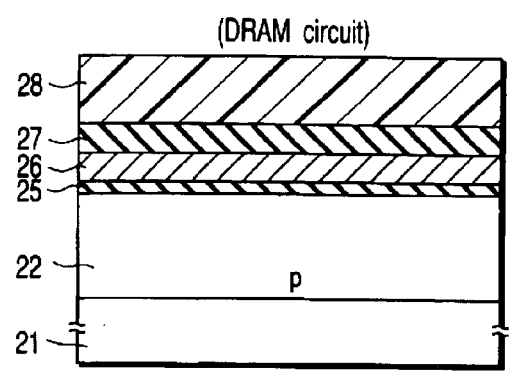

In the first step, a p-well region 22 and an n-well region (not shown) are formed on a semiconductor substrate 21 in order to form a CMOS transistor, followed by forming an isolation insulating film 23, as shown in FIGS. 7A and 7B. Then, gate insulating films 24 and 25 differing from each other in thickness are formed on the side of the inner logic circuit and on the side of the DRAM circuit, respectively. In this case, the gate insulating film 24 on the side of the inner logic circuit is formed thinner than the gate insulating film 25 on the side of the DRAM circuit. Then, a polysilicon film 26 is formed on the entire surface, followed by successively forming on the polysilicon film 26 an antireflection film 27 made of, for example, SiON and a resist 28 by a spin coating method.

In the next step, a pattern as shown in FIG. 15A and a pattern as shown in FIG. 15B are transferred onto the resist 28 on the side of the inner logic circuit and on the side of the DRAM circuit, respectively, by the lithography process of the Levenson method using a trim mask. It should be noted that, in FIG. 15A, a reference numeral 41 denotes a light shielding portion made of a Cr film. The light shielding portion 41 is formed to have a pattern of a size sufficiently larger than the gate width of the gate electrode of the MOS transistor formed on the side of the inner logic circuit. For example, the light shielding portion 41 is formed to have a pattern covering the entire active region including the gate electrode-forming region.

On the other hand, a reference numeral 42 shown in FIG. 15B denotes a light shielding portion made of a Cr film. The light shielding portion 42 is formed to have a pattern conforming with the gate electrode of the MOS transistor formed on the side of the DRAM circuit.

Figure 8A:
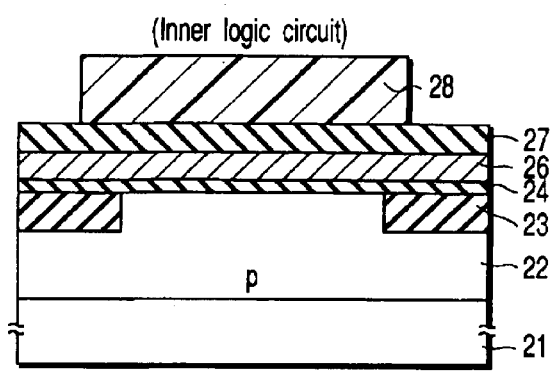
FIGS. 8A and 8B are cross sectional views showing the manufacturing step following the manufacturing step shown in FIGS. 7A and 7B.
Figure 8B:
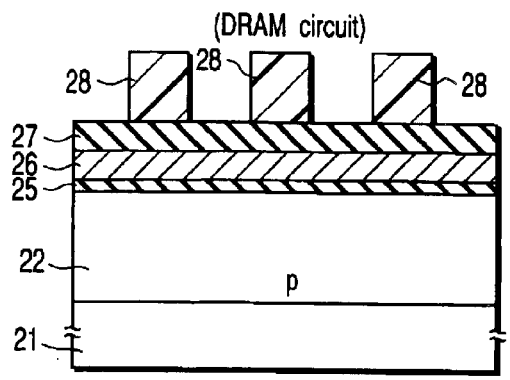

In the next step, a developing process is applied to the resist 28 to remove the unnecessary portion of the resist 28, leaving the shape as shown in FIGS. 8A and 8B.

Figure 9A:
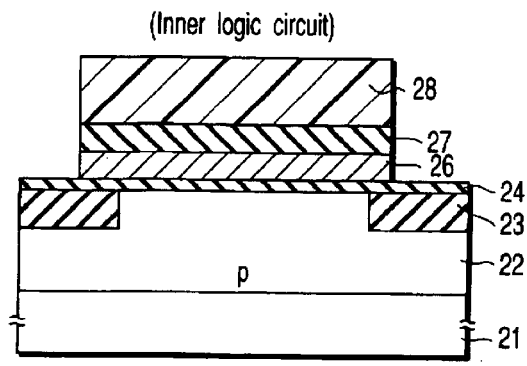
FIGS. 9A and 9B are cross sectional views showing the manufacturing step following the manufacturing step shown in FIGS. 8A and 8B.
Figure 9B:
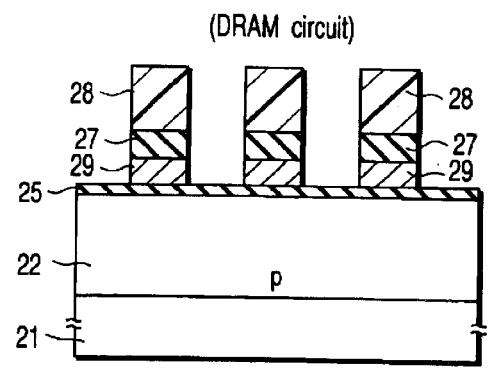

Then, the antireflection film 27 and the polysilicon film 26 are successively etched by an anisotropic dry etching by using the resist 28 as a mask. By the steps described above, a gate electrode 29 made of the polysilicon film 26 is formed on the side of the DRAM circuit, as shown in FIGS. 9A and 9B.

Figure 10A:
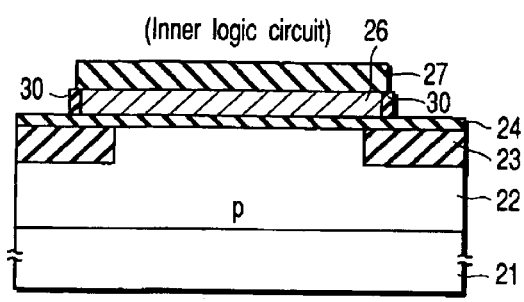
FIGS. 10A and 10B are cross sectional views showing the manufacturing step following the manufacturing step shown in FIGS. 9A and 9B.
Figure 10B:
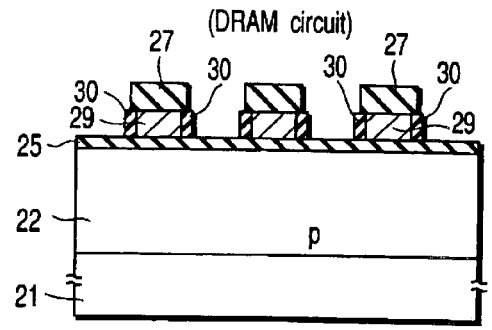
Figure 13A:
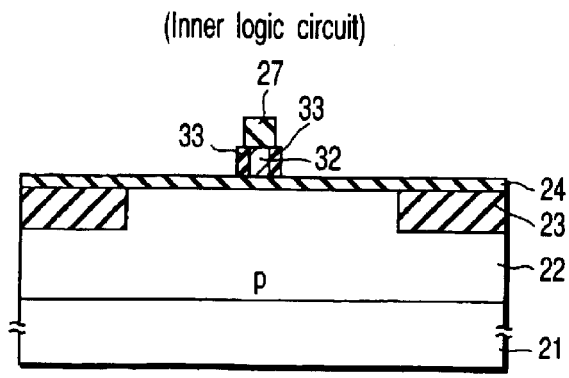
FIGS. 13A and 13B are cross sectional views showing the manufacturing step following the manufacturing step shown in FIGS. 12A and 12B.
Figure 13B:
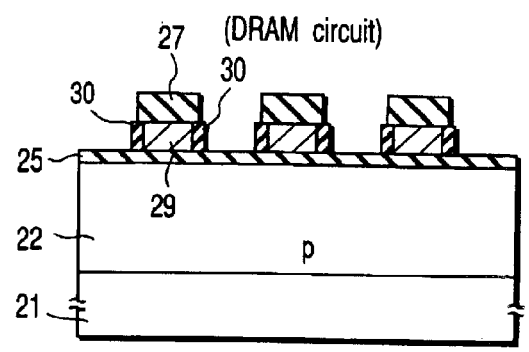

In the next step, the resist 28 is removed, followed by applying an RTO (rapid thermal oxidation) at, for example, 1,000° C. so as to form a gate post oxide film 30 on the circumferential side wall of the gate electrode 29 on the side of the DRAM circuit, as shown in FIGS. 10A and 10B. In forming the gate post oxide film 30, the corner portion in the lower portion of the gate electrode 29 is made roundish. Also, in this step, the oxide film 30 is also formed on the circumferential side wall of the polysilicon film 26 on the side of the inner logic circuit.

In the next step, the entire surface is coated with a new resist layer by, for example, a spin coating method, followed by transferring a pattern as shown in FIG. 16 to the resist layer in the inner logic circuit by the lithography process of the Levenson method using an Alt mask. Reference numeral 43 shown in FIG. 16 denotes a light shielding portion made of a Cr film. The light shielding portion 43 is formed to have a pattern conforming with the gate electrode of the MOS transistor formed in the inner logic circuit. Also, reference numeral 44 shown in FIG. 16 denotes a shifter portion for performing the phase reversal. Incidentally, the light shielding portion (not shown) is formed to cover the entire region on the side of the DRAM circuit.

After the pattern noted above is transferred onto the resist layer, a developing process is applied to remove the unnecessary resist, followed by a trimming treatment in which an isotropic etching reduces the size of the resist 31 on the side of the inner logic circuit. FIGS. 11A and 11B show the state after the trimming treatment. It should be noted that the entire surface is covered with the resist 31 on the side of the DRAM circuit.

In the next step, the antireflection film 27 and the polysilicon film 26 on the side of the inner logic circuit are successively etched with the resist 31 used as a mask, as shown in FIGS. 12A and 12B. As a result, formed is a gate electrode 32 made of the polysilicon film 26 having a desired size on the side of the inner logic circuit.

After formation of the gate electrode 32, the resist 31 is removed entirely, followed by applying an RTO at, for example, 1,000° C. so as to form a gate post oxide film 33 on the circumferential side wall of the gate electrode 33 on the side of the inner logic circuit. At the same time, the corner portion in the lower portion of the gate electrode 32 is made roundish. The gate post oxide film 33 is formed thinner than the gate post oxide film 30 formed previously on the circumferential side wall of the gate electrode 29 on the side of the DRAM circuit. In order to form the gate post oxide film 33 thinner than the gate post oxide film 30, it suffices to shorten, for example, the oxidizing treatment time. By forming thinner the gate post oxide film 33, the curvature of the roundish corner portion in the lower portion of the gate electrode 32 on the side of the inner logic circuit is rendered smaller than that of the gate electrode 29 on the side of the DRAM circuit.

In the next step, the antireflection film 27 is removed, followed by employing a standard CMOS process so as to form an LSI. For example, FIGS. 14A and 14B show the state that a MOS transistor having an extension structure is formed on the side of the inner logic circuit.

Figure 14A:
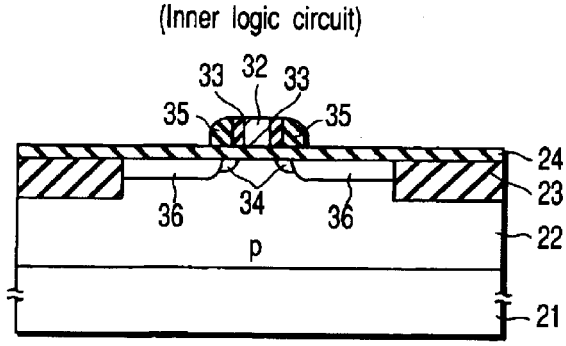
FIGS. 14A and 14B are cross sectional views showing the manufacturing step following the manufacturing step shown in FIGS. 13A and 13B.

The MOS transistor of the construction shown in FIG. 14A is formed, for example, as follows. In the first step, an impurity such as arsenic (As) is introduced into the p-well region 22 with the gate electrode 32 used as a mask so as to form a diffusion region 34 having a shallow junction. Then, a side wall insulating film 35 made of, for example, SiN is formed on the side wall of the gate electrode 32, followed by introducing, for example, arsenic (As) or phosphorous (P) into the p-well region 22 with the side wall insulating film 35 used as a mask so as to form a diffusion region 36 having a deep junction, thereby obtain a MOS transistor.

Figure 14B:
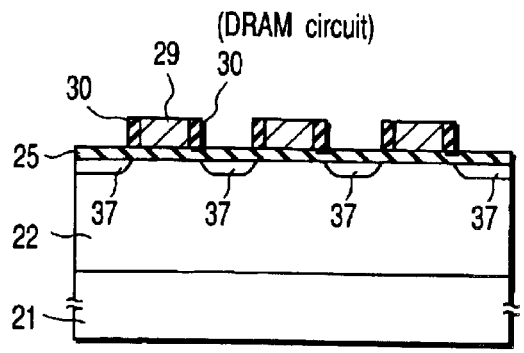

The MOS transistor on the side of the DRAM circuit shown in FIG. 14B can be obtained by introducing an impurity such as arsenic (As) into the p-well region 22 with the gate electrode 29 used as a mask so as to form a diffusion region 37.

In the method of the embodiment described above, the gate electrode 29 having a gate width of a size conforming to the resist pattern is formed on the side of the DRAM circuit. What should be noted is that the reduction in the width of the gate electrode, which is caused by the trimming treatment employed in the conventional method, need not be worried about in the method of the above embodiment. On the side of the inner logic circuit, the trimming treatment is applied after the resist is patterned, and the gate electrode is processed after the size of the resist is reduced, with the result that it is possible to form a MOS transistor having a fine gate width.

Further, in the method of the embodiment described above, the gate electrode on the side of the DRAM circuit is processed, and the gate post oxide film is formed in the MOS transistor on the side of the DRAM circuit. Then, the gate electrode on the side of the inner logic circuit is processed under the state that the side of the DRAM circuit is covered with a resist, and a gate post oxide film is formed in the MOS transistor on the side of the inner logic circuit. The particular method of the above embodiment makes it possible to form freely the gate post oxide film having a thickness required for each of the MOS transistors on the side of the DRAM circuit and on the side of the inner logic circuit.

Figure 17A:
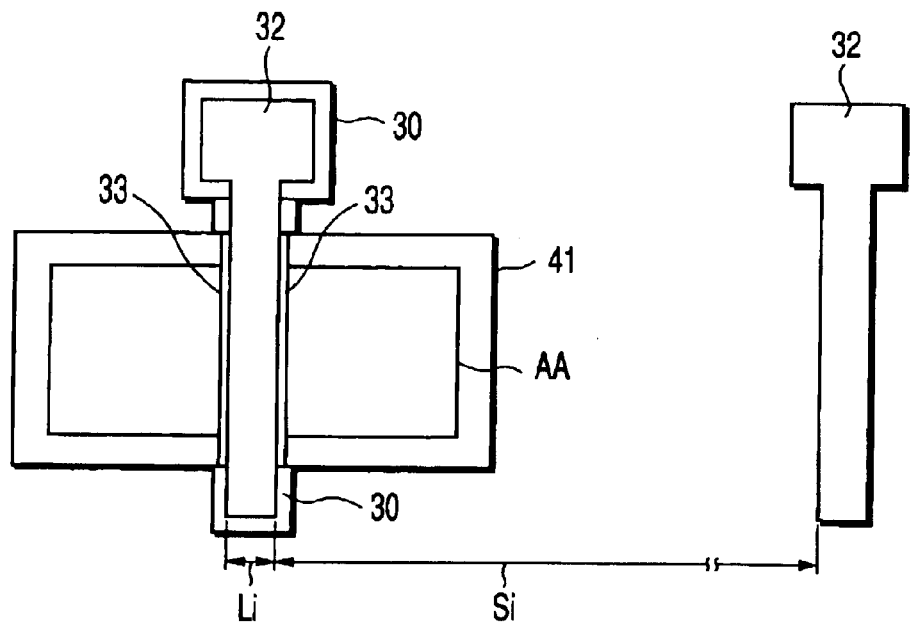
FIGS. 17A and 17B are plan views showing the inner logic side and the DRAM side, respectively, of an LSI manufactured by the method according to one embodiment of the present invention.
Figure 17B:
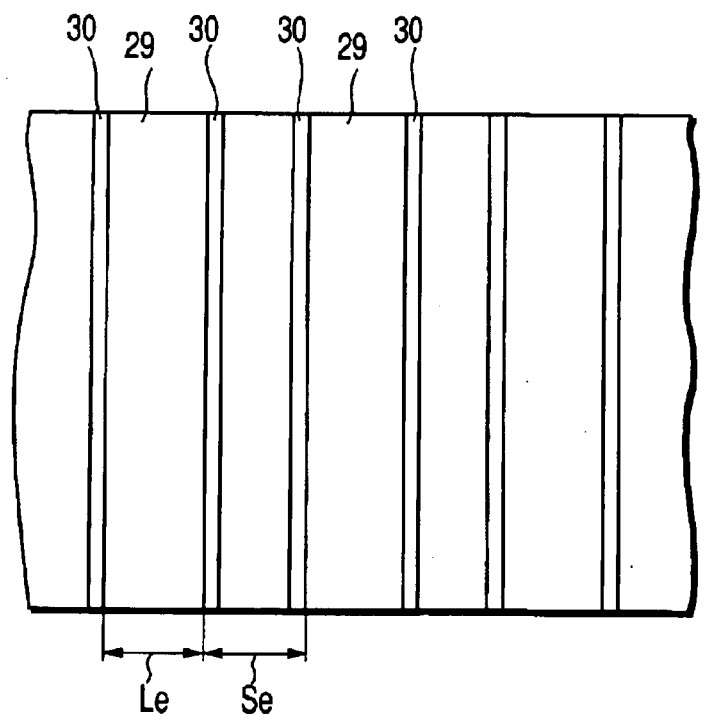

FIGS. 17A and 17B are plan views showing the side of the inner logic circuit and the side of the DRAM circuit, respectively, of the LSI manufactured by the method of the embodiment described above.

As shown in FIG. 17A, a plurality of MOS transistors are formed on the side of the inner logic circuit, and the gate electrode 32 of each of these plural MOS transistors is formed to have a gate width Li. In addition, the pitch of the gate electrodes 32 is set at Si. Incidentally, the letters AA shown in FIG. 17A denotes an active region, and reference numeral 41 denote the boundary of the light shielding portion of the mask shown in FIG. 15A. Also, the gate post oxide film 33 having a small thickness is formed on the circumferential side wall of the gate electrode 32 in the portion contiguous to and in the vicinity of the active region AA. Further, the gate post oxide film 30 equal in thickness to the thick gate post oxide film 30 formed on the circumferential side wall of the gate electrode 29 of the MOS transistor on the side of the DRAM circuit is formed in the other portion.

On the other hand, a plurality of MOS transistors are also formed on the side of the DRAM circuit, as shown in FIG. 17B. The gate electrode 29 of each of these plural MOS transistors is formed to have a gate width Le, and these gate electrodes 29 are formed at a pitch Se. Also, the gate post oxide film 30 having a large thickness is formed on the circumferential side wall of the gate electrode 29 of each of these MOS transistors.

It should be noted that the gate widths Li, Le and the pitches Si, Se of the gate electrodes are set to meet the relationships: Li<Le and Si>Se.

Suppose that, during operation of the LSI, a voltage of, for example, Vdd1 is applied to the gate electrode of each of a plurality of MOS transistors formed on the side of the inner logic circuit, and a voltage of, for example, Vdd2 is applied to the gate electrode of each of a plurality of MOS transistors formed on the side of the DRAM circuit. Where there is a relationship of vdd1<vdd2 between the voltages noted above, the intensities of the electric fields applied to the both electrodes can be rendered substantially equal to each other, because the gate post oxide film 30 formed on the circumferential side wall of the gate electrode 29 of the MOS transistor on the side of the DRAM circuit is thicker than the gate post oxide film 33 formed on the circumferential side wall of the gate electrode 32 of the MOS transistor on the side of the inner logic circuit.

In other words, even where the voltages applied to the gate electrodes of the MOS transistors differ from each other, it is possible to change the thickness of the gate post oxide film of each gate electrode in accordance with the voltage applied to the gate electrode of the MOS transistor, with the result that the intensities of the electric fields applied to the gate electrodes can be made substantially equal to each other so as to make it possible to cope easily with the use of a multiple power sources. The phase shift method includes a method called "half tone" in addition to the Levenson method. In the half tone method, the light irradiating the blanks for forming a pattern on a reticle (mask) is not completely shielded, and the phase of several percent to scores of percent of light is revered and transmitted through the blanks so as to improve the contrast in the edge portion of the pattern. The effect of improving the contrast produced by the half tone method is smaller than that produced by the Levenson method. However, the half tone method is free from the restriction in the arrangement of the pattern, though the Levenson method makes it necessary to keep the shifter arranged adjacent to the blanks so as to reverse the phase of is the transmitting light.

In the method of the embodiment described above, patterns are transferred from the Alt mask and the trim mask onto different resist layers. Therefore, it is possible to improve the processing margin in processing the wiring of a fine pitch like a DRAM circuit by using a half tone mask in the lithography using the trim mask.

In the embodiment described above, the antireflection film 27 is coated with the resist 28 in order to prevent an adverse effect produced by the reflection of light in the light exposure step. Alternatively, it is also possible to form a film of a material that does not produce an antireflection effect and ensures an etching selectivity ratio to the polysilicon film 26, e.g., a film consisting of $SiO_2$ and SiN, on the polysilicon film 26 in place of forming the antireflection film 27. In this case, however, it is necessary to form an antireflection film capable of etching simultaneously with the resist material on the film consisting of $SiO_2$ and SiN.

Also, it is possible to allow the open portion of the trim mask not to overlap with the active region in view of the deviation in the mask alignment, the nonuniformity of the size in the processing and the trimming amount of the resist. In this case, in removing the gate post oxide film providing an obstacle in processing the MOS transistor on the side of the inner logic circuit, it is possible to prevent the gate insulating film on the active region from being etched and, thus, to prevent the active region from being etched in the step of processing the gate electrode.

Figure 18A:
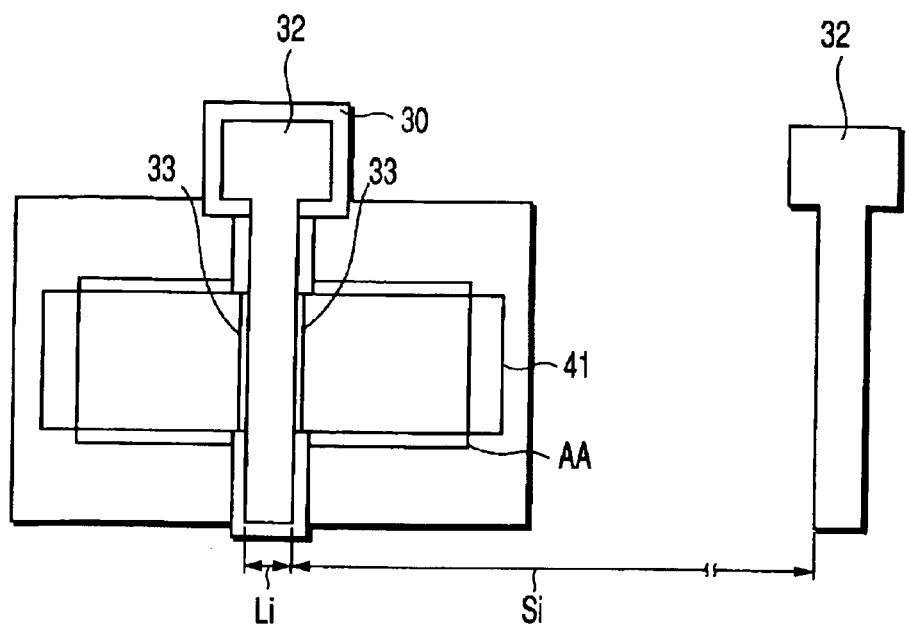
FIGS. 18A and 18B are plan views showing the inner logic side and the DRAM side, respectively, of an LSI manufactured by the method according to a modification of the present invention.
Figure 18B:
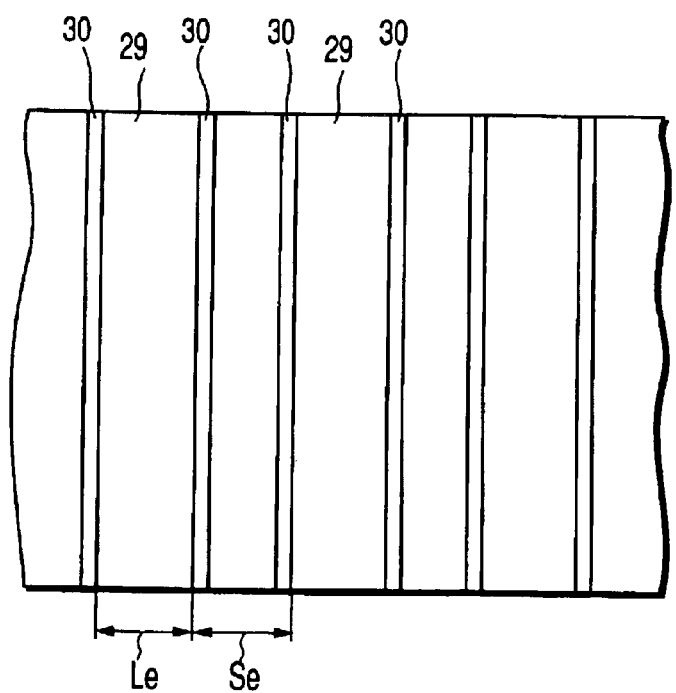

FIGS. 18A and 18B are plan views collectively showing a modification of the embodiment described above. In this modification, the gate post oxide film 30 having a large thickness, which constitutes the gate post oxide film of the MOS transistor on the side of the inner logic circuit, is formed to extend partly inside the active region AA as shown in FIGS. 18A and 18B so as to improve the breakdown voltage and the reliability of the MOS transistor. The particular shape can be realized by forming smaller the pattern of the light shielding portion 41 of the trim mask shown in FIG. 15A as shown in FIG. 18A.

In the embodiment described above, one channel type, i.e., N-channel type, MOS transistor alone is formed on the side of the inner logic circuit. Needless to say, a P-channel type MOS transistor is formed in the n-well region in this case.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming a gate insulating film in each of a region in which a first MOS transistor is to be formed and another region in which a second MOS transistor is to be formed on a semiconductor substrate;

forming a film of a gate electrode material on the entire surface of said gate insulating film;

forming said first film of a resist material on the entire surface of said gate electrode material;

patterning said first film of said resist material in a manner to have a pattern of a size larger than a gate width of said gate electrode of at least said first MOS transistor in a region where said first MOS transistor is to be formed and to have a pattern conforming with a gate electrode of said second MOS transistor in a region in which said second MOS transistor is to be formed so as to form a first mask;

selectively etching said film of said gate electrode material by an etching method using said first mask so as to form said gate electrode of said second MOS transistor;

after removing said first mask, applying an oxidizing treatment so as to form a first gate post oxide film on a circumferential side wall of said gate electrode of at least said second MOS transistor;

after forming a second film of a resist material on the entire surface of said regions where said first and second MOS transistors are to be formed, patterning said second film of said resist material in a manner to have a pattern conforming with said gate electrode of said first MOS transistor in a region where said first MOS transistor is to be formed and a pattern covering the entire surface in a region in which said second MOS transistor is to be formed so as to form a second mask;

selectively etching said film of said gate electrode material by an etching method using said second mask so as to form said gate electrode of said first MOS transistor; and applying an oxidizing treatment so as to form a second gate post oxide film differing in thickness from said first gate post oxide film on a circumferential side wall of said gate electrode of said first MOS transistor in a region other than a region in which said first gate post oxide film is formed.

2. The method of manufacturing a semiconductor device according to claim 1, wherein said second gate post oxide film is formed to permit said second gate post oxide film to be thicker than said first gate post oxide film.

3. The method of manufacturing a semiconductor device according to claim 1, wherein gate insulating films having different thicknesses are formed in a region where said MOS transistor is to be formed and in a region where said second MOS transistor is to be formed.

4. The method of manufacturing a semiconductor device according to claim 1, further comprising:

etching said resist pattern in a region where said first MOS transistor is to be formed after formation of said second mask so as to reduce a size of said resist pattern.

* * * * *